(12) United States Patent
Canfield et al.

(10) Patent No.: US 8,953,332 B2
(45) Date of Patent: Feb. 10, 2015

(54) POSITIVE PRESSURE-APPLYING COMPLIANT LATCH MECHANISM

(75) Inventors: Shawn Canfield, Poughkeepsie, NY (US); Michael T. Peets, Staatsburg, NY (US); Wade H. White, Hyde Park, NY (US)

(73) Assignee: International Business Machines Corporation, Armonk, NY (US)

( * ) Notice: Subject to any disclaimer, the term of this patent is extended or adjusted under 35 U.S.C. 154(b) by 378 days.

(21) Appl. No.: 13/442,896

(22) Filed: Apr. 10, 2012

(65) Prior Publication Data
US 2013/0265695 A1 Oct. 10, 2013

(51) Int. Cl.
*H05K 7/14* (2006.01)

(52) U.S. Cl.
USPC ........................................ 361/759; 403/322.4

(58) Field of Classification Search
CPC .. H05K 5/0221; H05K 5/0256; H05K 7/1409
USPC .............. 403/321, 322.4, 325; 361/759, 740, 361/801; 439/152, 153, 157, 310, 372
See application file for complete search history.

(56) References Cited

U.S. PATENT DOCUMENTS

| | | |
|---|---|---|
| 4,885,436 A | 12/1989 | Pham et al. |
| 5,035,634 A | 7/1991 | Hasircoglu et al. |
| 5,135,408 A | 8/1992 | Suzuki |
| 5,344,194 A | 9/1994 | Hatagishi et al. |
| 5,823,809 A | 10/1998 | Wakata |
| 6,125,017 A | 9/2000 | Misso et al. |
| 6,210,193 B1 | 4/2001 | Ito et al. |
| 6,266,248 B1 * | 7/2001 | Hanas et al. ................... 361/752 |
| 6,300,784 B1 | 10/2001 | Yamamoto |
| 6,418,027 B1 | 7/2002 | Suzuki et al. |
| 6,490,153 B1 * | 12/2002 | Casebolt et al. ......... 361/679.33 |
| 6,515,866 B2 | 2/2003 | Ulrich |
| 6,572,391 B2 * | 6/2003 | Mochizuki et al. ........... 439/157 |
| 6,912,124 B2 * | 6/2005 | Megason et al. ......... 361/679.02 |
| 6,961,249 B2 * | 11/2005 | Wong ............................ 361/801 |
| 7,465,181 B1 | 12/2008 | Bridges et al. |
| 7,503,795 B2 | 3/2009 | Yamaji et al. |

(Continued)

FOREIGN PATENT DOCUMENTS

| | | | |
|---|---|---|---|
| DE | 10204180 C1 | 2/2002 | |
| EP | 0 660 653 | * 1/1999 | ............... H05K 7/14 |

(Continued)

*Primary Examiner* — Michael P Ferguson
(74) *Attorney, Agent, or Firm* — Margaret A. McNamara, Esq.; Kevin P. Radigan, Esq.; Heslin Rothenberg Farley & Mesiti P.C.

(57) ABSTRACT

A latch mechanism is provided for latching a field-replaceable unit within an enclosure. The latch mechanism includes a rotatable latch coupled to the field-replaceable unit, via a pivot, at a first side of the field-replaceable unit, and a compliant spring member disposed to act on the pivot. The compliant spring member acts on the pivot and compresses with rotating of the latch from an open position to a latched position during latching of the field-replaceable unit within the enclosure. The compressing facilitates provision of a positive pressure on or across the field-replaceable unit directed towards a second side of the field-replaceable unit opposite to the first side. This positive pressure facilitates, for example, fixed coupling of a first connector at the second side of the field-replaceable unit to a second connector associated with the enclosure when the field-replaceable unit is latched within the enclosure.

15 Claims, 12 Drawing Sheets

(56) References Cited

U.S. PATENT DOCUMENTS

| | | | |
|---|---|---|---|
| 2007/0149018 A1* | 6/2007 | Gunther et al. | 439/160 |
| 2009/0070971 A1 | 3/2009 | Kamada et al. | |
| 2010/0257715 A1* | 10/2010 | Wang et al. | 29/270 |
| 2010/0261371 A1 | 10/2010 | Morinari | |
| 2011/0080705 A1* | 4/2011 | Figuerado et al. | 361/679.33 |
| 2011/0171844 A1 | 7/2011 | Chen | |

FOREIGN PATENT DOCUMENTS

| | | |
|---|---|---|
| EP | 1032085 A2 | 8/2000 |
| JP | 2008074725 A | 10/2008 |

\* cited by examiner

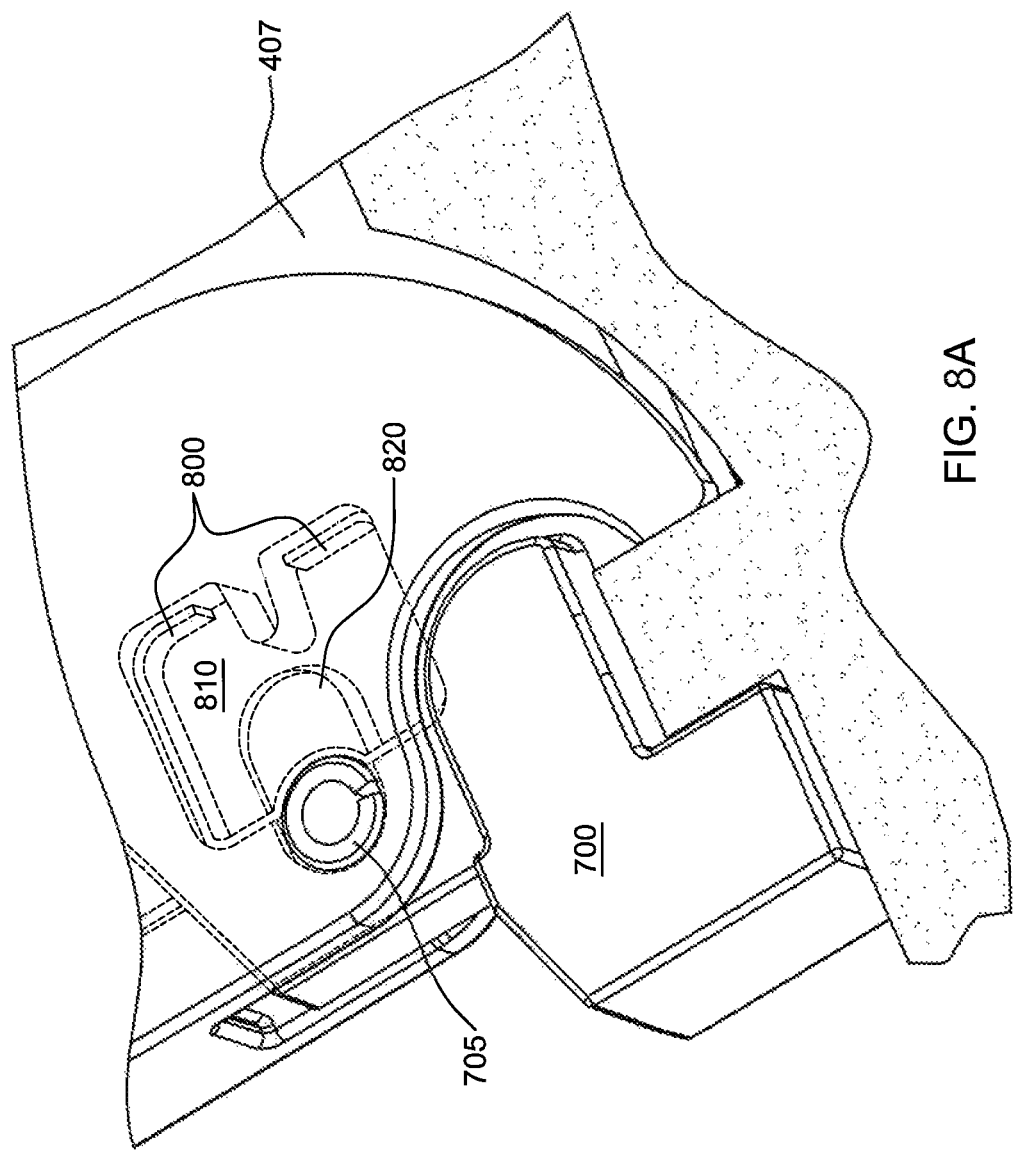

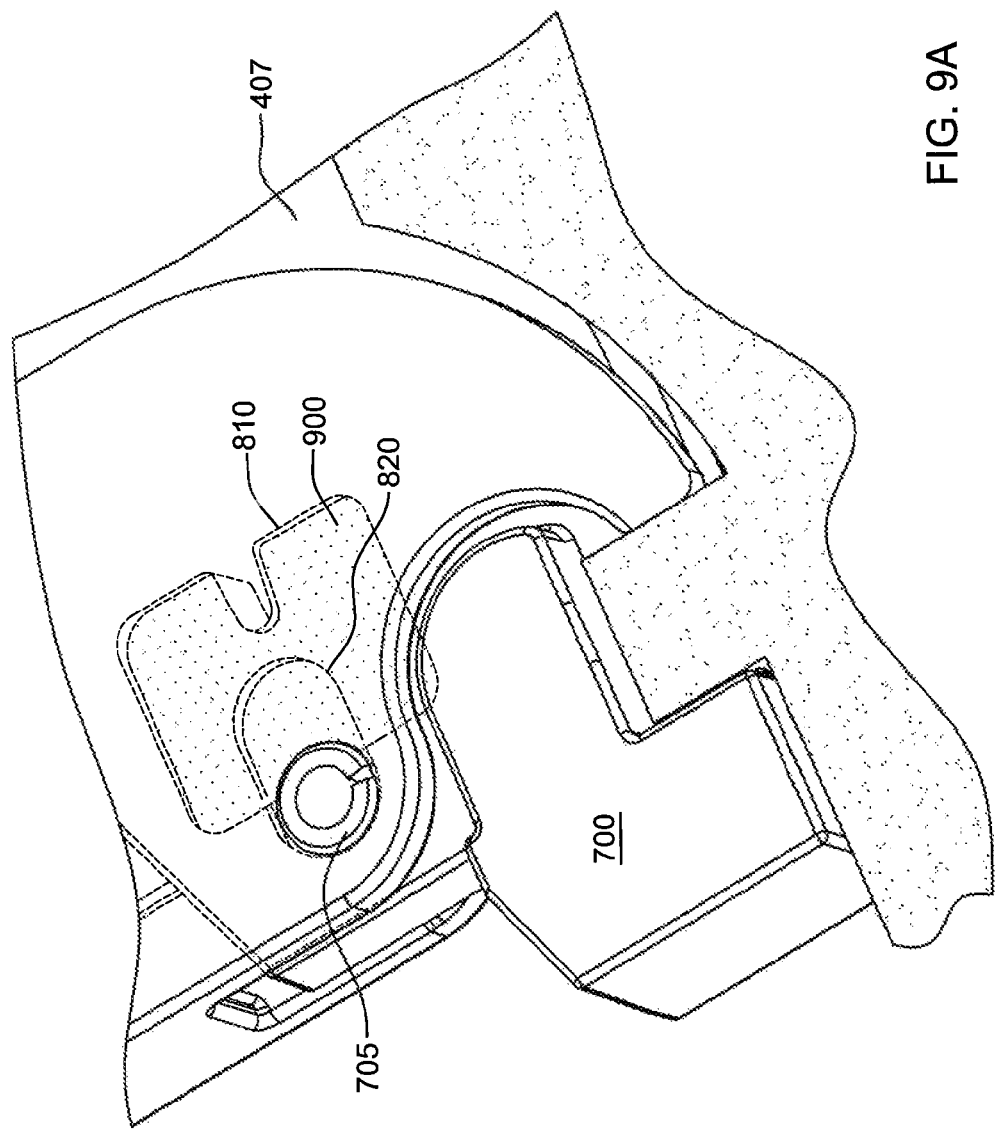

POSITIVE PRESSURE-APPLYING COMPLIANT LATCH MECHANISM

BACKGROUND

A field-replaceable unit (FRU), also referred to as a customer-replaceable unit (CRU), may comprise a circuit board, part or assembly that can be readily removed from an electronics enclosure (or chassis), such as a personal computer, or other piece of electronic equipment, and replaced by a user or technician without having to send the entire electronics enclosure or system to a repair facility. For example, field-replaceable units allow a technician lacking an in-depth product knowledge of a particular system to fault isolate and replace a faulty component or unit. Field-replaceable units are not strictly confined to computers, but also may comprise part of many higher-end consumer and commercial electronic products.

As the sophistication and complexity of multi-replaceable unit electronics in both commercial and consumer industries has increased, many design and manufacturing organizations have expanded the use of field-replaceable units to, for example, storage devices. As one example, one or more solid state drive (SSD) field-replaceable units may be employed as storage within an electronic system or rack. In such a field-replaceable unit, a first connector associated with the unit couples to a second connector associated with the electronics enclosure, and these connectors couple as the field-replaceable unit is docked within the enclosure. Positive pressure or force can be applied on the first connector to the second connector by, for example, mechanical bolts or screws. However, the use of mechanical bolts or screws to, for example, ensure positive force on the connectors requires the use of tools, which adds complexity to the field replaceability of the field-replaceable unit.

BRIEF SUMMARY

The shortcomings of the prior art are overcome and additional advantages are provided through the provision, in one aspect, of a latch mechanism for latching a unit within an enclosure. The latch mechanism includes: a rotatable latch coupled to the unit via a pivot, the pivot being disposed at a first side of the unit; and a compliant spring member disposed to act on the pivot, the compliant spring member acting on the pivot and compressing with rotating of the latch from an open position to a latched position during latching of the unit within the enclosure, the compressing facilitating provision of a positive pressure on the unit directed towards a second side of the unit opposite to the first side thereof with latching of unit within the enclosure.

In a further aspect, an electronic system is provided which includes at least one field-replaceable unit (FRU), an enclosure comprising at least one FRU-receiving slot, and at least one latching mechanism. The at least one field-replaceable unit is configured to operationally dock within the at least one FRU-receiving slot of the enclosure. One latching mechanism of the at least one latching mechanism is disposed at a first side of one field-replaceable unit of the at least one field-replaceable unit and includes: a rotatable latch coupled to the one field-replaceable unit by a pivot disposed at the first side of the one field-replaceable unit, and a compliant spring member disposed to act on the pivot, wherein rotating of the latch from an open position to a latched position during latching of the one field-replaceable unit within the enclosure facilitates provision of a positive pressure on the one field-replaceable unit directed towards a second side of the one field-replaceable unit opposite to the first side thereof, the positive pressure resulting, at least in part, from the compliant spring member acting on the pivot and compressing with rotating of the latch towards the latched position during latching of the one field-replaceable unit within the enclosure.

In a further aspect, a method of facilitating secure latching of a field-replaceable unit within an enclosure is provided. The method includes: providing a latch mechanism coupled to the field-replaceable unit and configured to facilitate secure latching of the field-replaceable unit within the enclosure. The latch mechanism includes: a rotatable latch coupled to the field-replaceable unit via a pivot, the pivot being disposed at a first side of the field-replaceable unit; and a compliant spring member disposed to act on the pivot, the compliant spring member acting on the pivot and compressing with rotating of the latch from an open position to a latched position during latching of the field-replaceable unit within the enclosure, the compressing facilitating provision of a positive pressure on the field-replaceable unit directed towards a second side of the field-replaceable unit opposite to the first side thereof with latching of the field-replaceable unit within the enclosure.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

FIG. 8A is an enlarged, partial depiction of one embodiment of the latch mechanism, shown comprising a metal spring which spring loads the pivot axis of the latch to facilitate providing a positive pressure on the field-replaceable unit directed towards the second side thereof, in accordance with one or more aspects of the present invention;

FIG. 9A is an enlarged partial depiction of an alternate embodiment of the latch mechanism, shown comprising a compliant, elastomeric material which spring loads the pivot axis of the latch to facilitate providing a positive pressure on the field-replaceable unit directed towards the second side thereof, in accordance with one or more aspects of the present invention.

DETAILED DESCRIPTION

As used herein, the terms "electronics rack", and "rack" are used interchangeably, and unless otherwise specified include any housing, frame, rack, compartment, blade server system, etc., having one or more components of a computer system or electronics system, and may be, for example, a stand-alone computer server unit having high, mid or low end processing capability. In one embodiment, an electronics rack may comprise at least one electronic subsystem, one or more of which accommodate one or more field-replaceable units. "Electronic subsystem" refers to any sub-housing, enclosure, blade, book, drawer, node, compartment, etc., having one or more electronic components disposed therein. Each electronic subsystem of an electronics rack may be movable or fixed relative to the electronics rack, with rack-mounted electronic drawers of a multi-drawer rack unit and blades of a blade center system being two examples of subsystems of an electronics rack. As one example, one or more electronic subsystems within the electronics rack may be server units requiring additional input/output and/or computer storage capability. As one specific example, the electronics rack may be an IT Enterprise Computer System, implemented, for example, employing System z server units, or System p server units, offered by International Business Machines Corporation. System z and System p are trademarks of International Business Machines Corporation, of Armonk, N.Y.

Further, as used herein, "enclosure" comprises any housing, chassis, frame, container, etc., configured to accommodate one or more components of, for example, a computer system or an electronic system. Further, "field-replaceable unit" is used herein to comprise any insertable, removable, and/or replaceable component, such as a modular component, which may be docked to or undocked from an enclosure. Note that the solid state drive (SSD) sleds or assemblies discussed herein present only one example of a field-replaceable unit with which the disclosed latching mechanism may be employed. Still further, a "connector" refers to any connect structure or assembly employed to render the field-replaceable unit operable within the enclosure, and may comprise an electrical, electronic or communication connector, etc.

Reference is made below to the drawings, which are not drawn to scale for ease of understanding, wherein the same reference numbers used throughout different figures designate the same or similar components.

Figure 1:
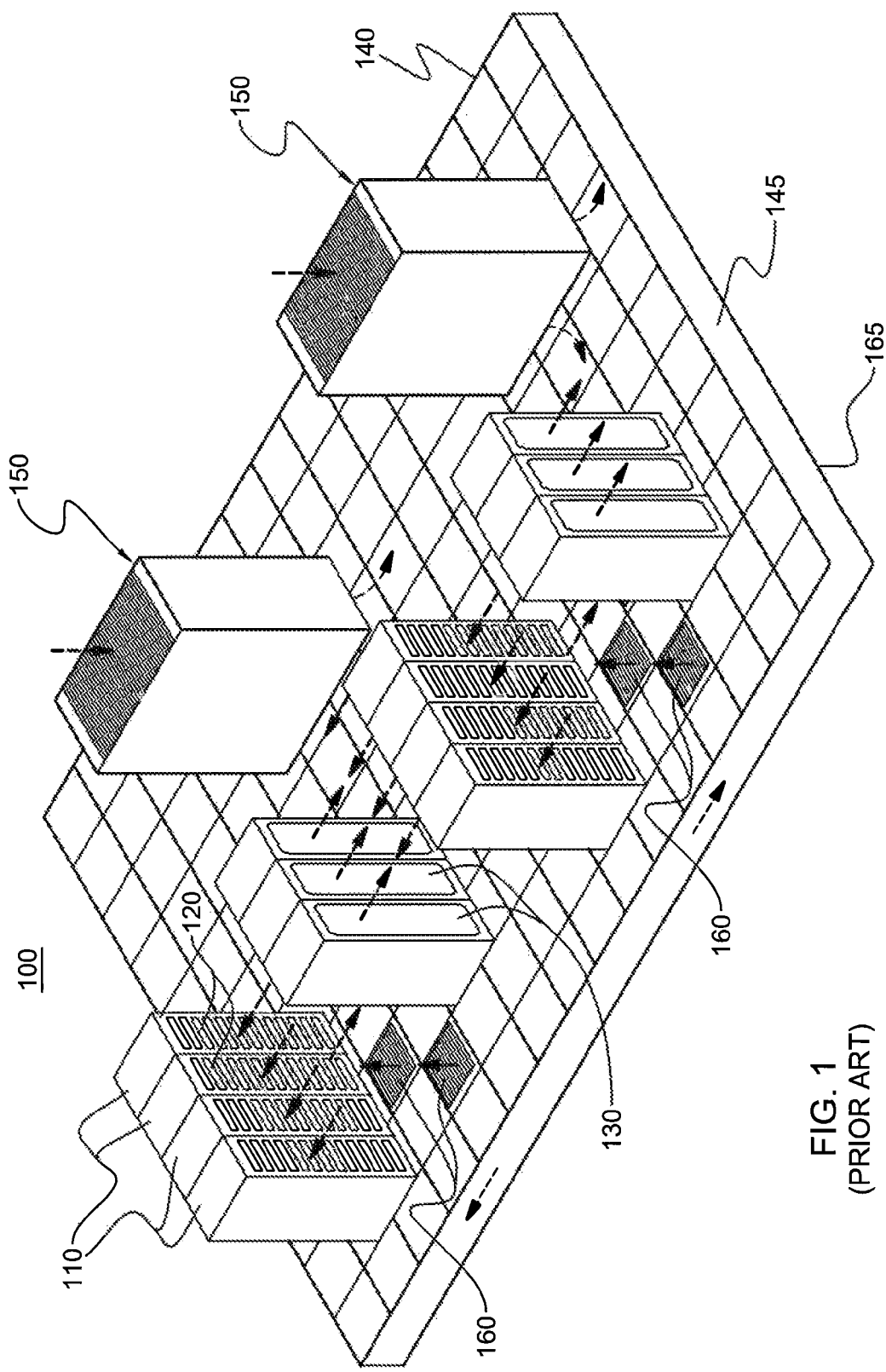
FIG. 1 depicts one embodiment of a conventional raised floor layout of a computer installation comprising multiple electronics racks.

FIG. 1 depicts a raised floor layout of a data center 100 typical in the prior art, wherein multiple electronics racks 110 are disposed in one or more rows. A data center such as depicted in FIG. 1 may house several hundred, or even several thousand microprocessors. In the arrangement illustrated, chilled air enters the computer room via perforated floor tiles 160 from a supply air plenum 145 defined between the raised floor 140 and a base or sub-floor 165 of the room. Cooled air is taken in through louvered or screened doors at the front (i.e., air inlet sides 120) of the electronics racks and expelled through the back (i.e., air outlet sides 130) of the electronics racks. Each electronics rack 110 may have one or more air moving devices (e.g., fans or blowers) to provide forced inlet-to-outlet airflow to cool the electronic components within the drawer(s) of the rack. The supply air plenum 145 provides conditioned and cooled air to the air-inlet sides of the electronics racks via perforated floor tiles 160 disposed in a "cold" aisle of the computer installation. The conditioned and cooled air is supplied to plenum 145 by one or more air conditioning units 150, also disposed within the data center 100. Room air is taken into each air conditioning unit 150 near an upper portion thereof. This room air comprises in part exhausted air from the "hot" aisles of the computer installation defined by opposing air outlet sides 130 of the electronics racks 110.

Figure 2:
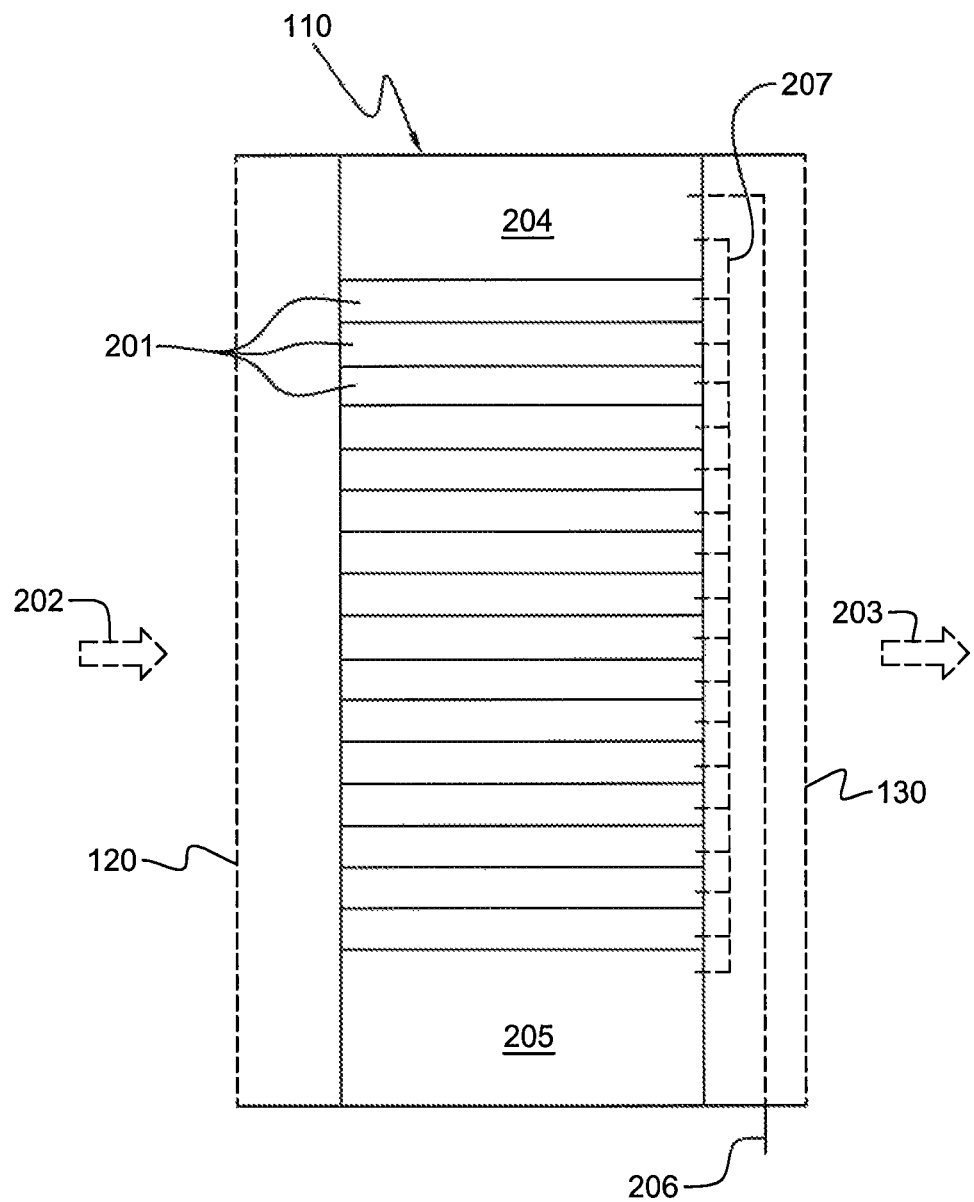
FIG. 2 is a cross-sectional elevational view of one embodiment of an electronics rack comprising, in one embodiment, one or more electronic subsystems configured to accommodate one or more field-replaceable units which may employ latching mechanisms, in accordance with one or more aspects of the present invention.

FIG. 2 is an elevational representation of one embodiment of a an electronics rack 110. In the embodiment shown, electronics rack 110 includes a plurality of electronic subsystems 201, which (in the embodiment illustrated) are air-cooled by cool air 202 ingressing via louvered air inlet door 210, and exhausting out louvered air outlet door 211 as hot air 203. Electronics rack 110 also includes (in one embodiment) at least one bulk power assembly 204. One or more electronic subsystems 201 include, in one example, one or more processors, associated memory, input/output adapters and disk storage devices. Also illustrated in FIG. 2 is an I/O and disk expansion subsystem 205, which includes, in one detailed example, PCIe card slots and disk drivers for one or more electronic subsystems of the electronics rack. Note that I/O and disk expansion subsystem 205 could be disposed anywhere within electronics rack 110, with the positioning shown in FIG. 2 being provided as one example only. For example, the I/O and disk expansion subsystem 205 could alternatively be disposed in the middle of the electronics rack, if desired.

In one rack example, a three-phase AC source feeds power via an AC power cord 206 to bulk power assembly 204, which transforms the supplied AC power to an appropriate DC power level for output via distribution cables 207 to the plurality of electronics subsystems 201. AC power cord 206 supplies, in one example, three phase electrical power. The number and type of electronic subsystems installed in the electronics rack are variable and depend on customer requirements for a particular system.

As noted initially, field-replaceable units have the advantage of being able to be readily added, removed and/or replaced in a system, without having to send the entire system to a repair facility. Further, the modular nature of field-replaceable units allows for tailoring of system configuration and subsequent system expansion as needed for a particular application. For example, a portion of an electronic subsystem enclosure may be configured to accommodate an expandable number of solid state drive (SSD) assemblies as field-replaceable units.

Figure 3:
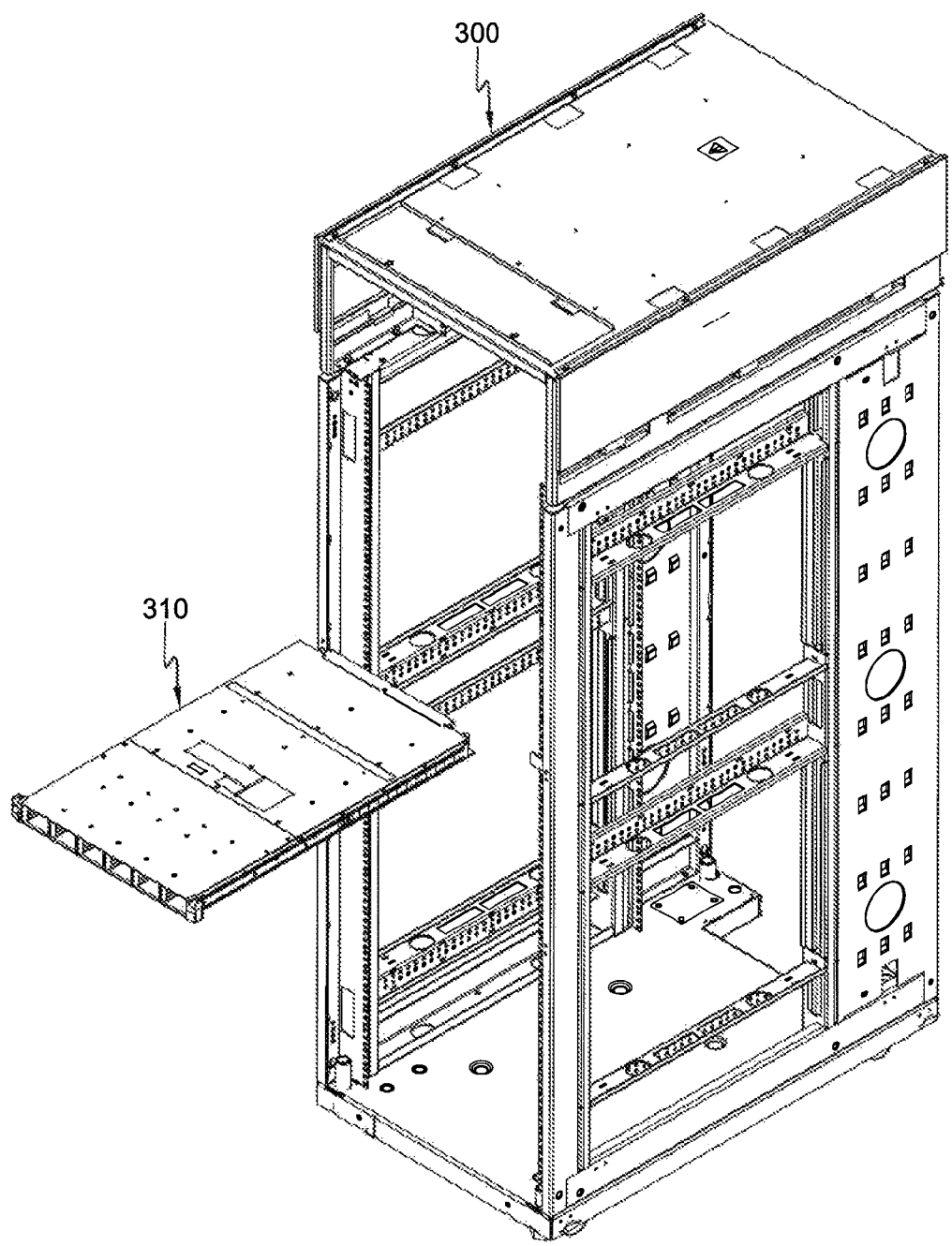
FIG. 3 depicts one embodiment of a rack frame and an electronic subsystem comprises an enclosure configured to receive multiple field-replaceable units to be latched therein, in accordance with one or more aspects of the present invention.
Figure 4:
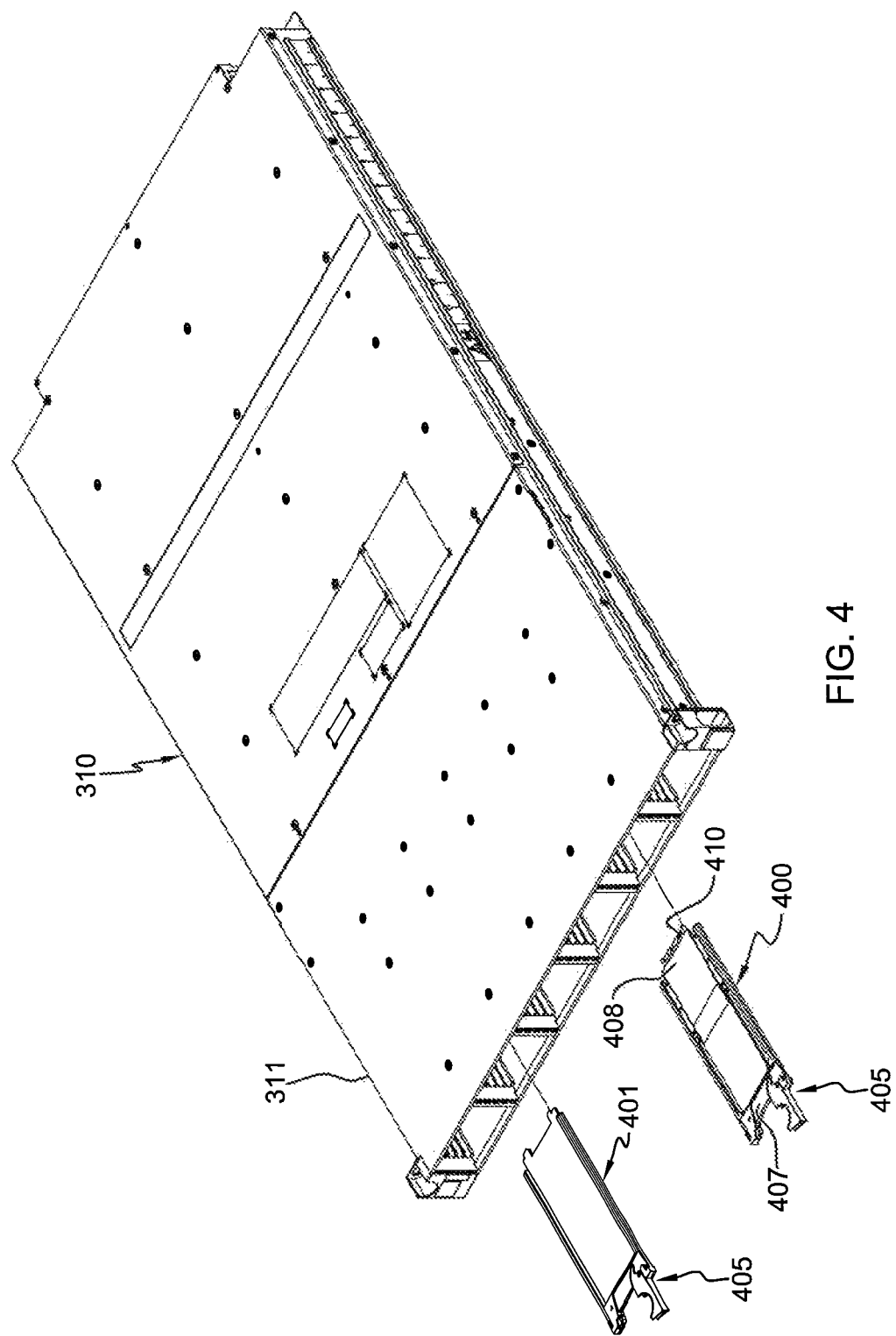
FIG. 4 depicts the electronic subsystem of FIG. 3, and illustrates one embodiment of a field-replaceable unit (FRU), and one embodiment of a filler unit, both to be slidably docked into respective FRU-receiving slots in the enclosure, in accordance with one or more aspects of the present invention.
Figure 5:
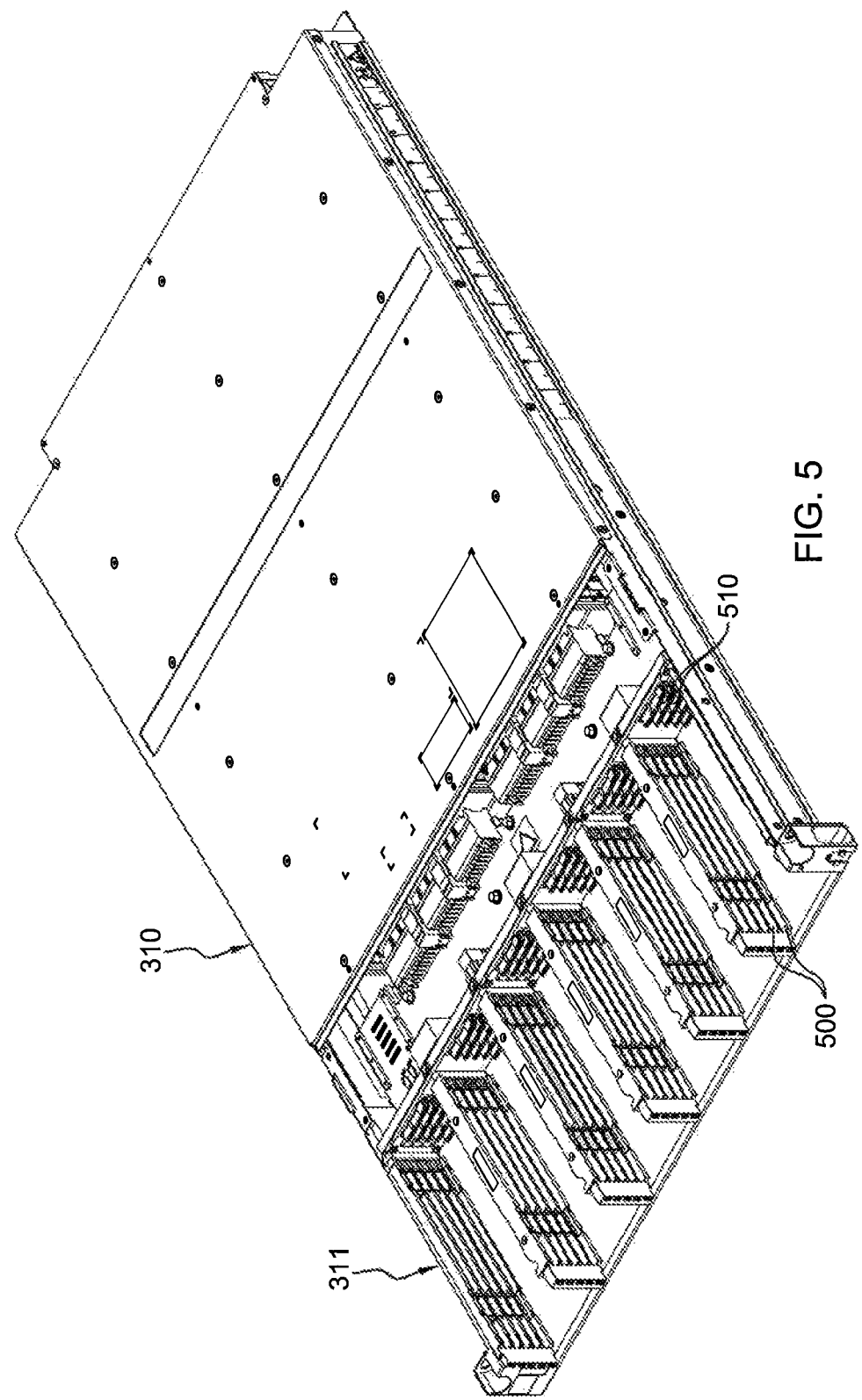
FIG. 5 depicts the electronic subsystem of FIG. 4, with the cover partially removed from the enclosure to expose multiple FRU-receiving slots within the enclosure at a first side thereof, in accordance with one or more aspects of the present invention.

Referring collectively to FIGS. 3-5, in one embodiment, an electronic system may comprise a rack frame 300, which accommodates a plurality of electronic subsystems, with one electronic subsystem 310 being illustrated in FIGS. 3-5, by way of example. Electronic subsystem 310 comprises an enclosure 311 configured to accommodate, at least in part, a plurality of field-replaceable units 400 (FIG. 4), which slidably dock within respective field-replaceable unit (FRU)-receiving slots 500 (FIG. 5) at, in this example, one end of enclosure 311. In FIG. 5, the cover of electronics enclosure 311 has been partially removed to expose (in this embodiment) multiple columns of FRU-receiving slots 500, each configured to receive a respective field-replaceable unit or a filler unit 401 (FIG. 4). One or more blank filler units 401 may be employed within enclosure 311 to facilitate a balanced airflow through the electronic subsystem from the air inlet side to the air outlet side thereof, that is, notwithstanding that a smaller number of field-replacement units 400 than can be accommodated may be employed in particular implementation.

Disclosed herein is a latch mechanism 405 (FIG. 4) which facilitates secure, positive pressure latching of a field-replaceable unit 400 within an FRU-receiving slot 500 of enclosure 311, as described further below. This latch mechanism 405 is disposed at a first side or end 407 of field-replaceable unit 400, and although not required for filler unit 401, similar latch mechanism(s) 405 could be employed with the filler unit(s) as well. A connector assembly may also be provided comprising at least one first connector 410 at a second side or end 408 of the field-replaceable unit 400, and at least one second connector 510 (FIG. 5) associated with enclosure 311, for example, mounted to a mid plane within the enclosure. With slidable docking of field-replaceable unit 400 within an FRU-receiving slot 500, contacts within the at least one first connector 410 electrically connect to respective contacts within the at least one second connector 510 of the connector assembly, thereby ensuring operational coupling of the field-replaceable unit 400 within the electronic subsystem 310.

Note that the depicted six columns of FRU-receiving slots 500, each with five rows, is presented by way of example only. Also note that latch mechanism 405 may be employed with each field-replaceable unit, or only selected field-replaceable units, depending upon the implementation. In general, the latch mechanism disclosed herein may be employed with any unit where a positive pressure on the unit directed from a first side towards a second side thereof is desired with latching of the unit within the enclosure. This positive pressure advantageously ensures fixed mechanical and electrical connection of, for example, the at least one first connector and the at least one second connector of a connector assembly. More particularly, positive pressure advantageously ensures, for example, that during shipping or operation, any vibration of the electronic subsystem does not cause connector contacts to move in relation to each other, which might otherwise cause wearing of the contacts, and possibly result in failure or intermittent failure of the electronic subsystem. Further, the latch mechanism disclosed herein advantageously facilitates the addition, removal and/or replacement of a unit within a system. For example, the latch mechanism can facilitate in-field upgrading of a system through the ready addition of further units to the system.

Figure 6A:
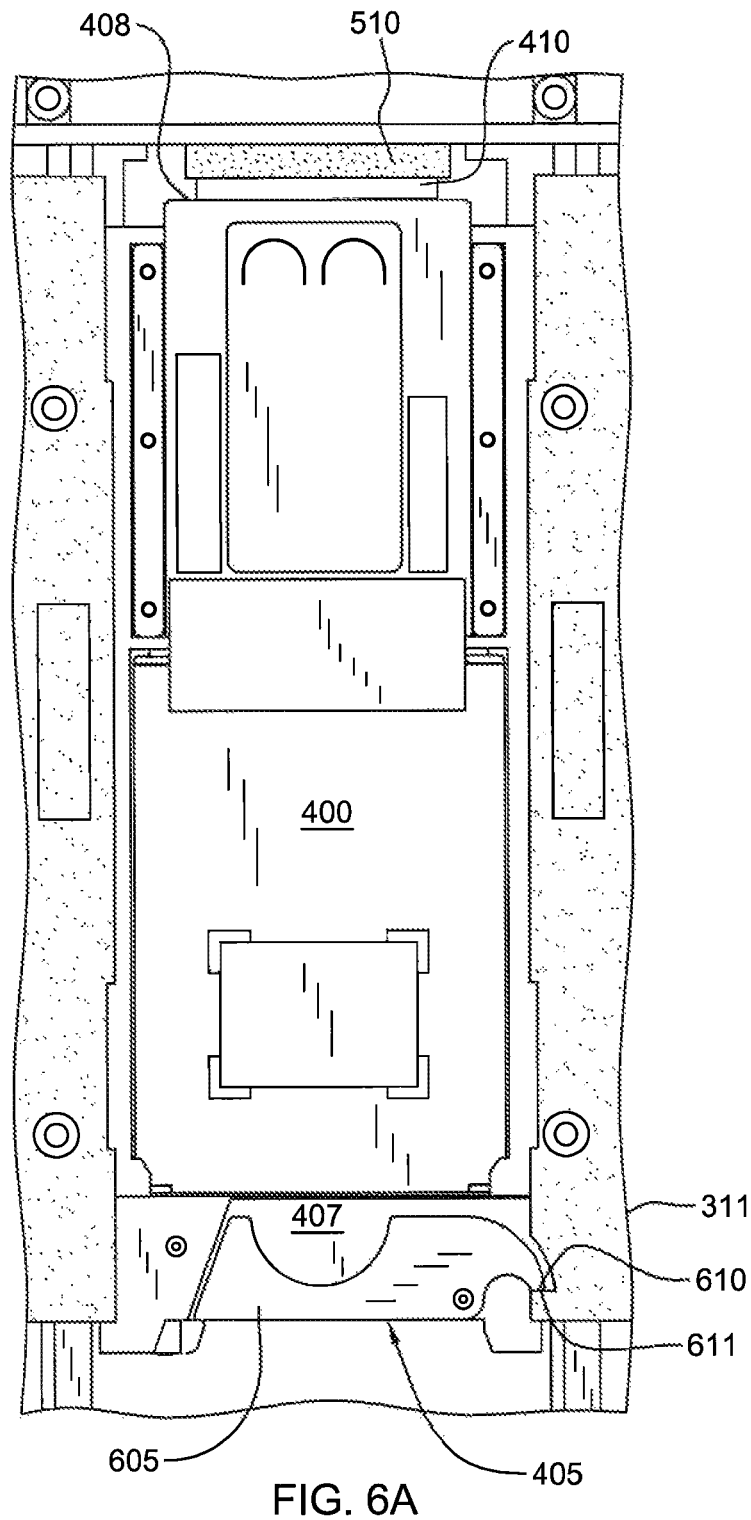
FIG. 6A is a top plan view of one embodiment of a field-replaceable unit docked and latched within a respective FRU-receiving slot in the enclosure of the electronic subsystem of FIGS. 4 & 5, in accordance with one or more aspects of the present invention.
Figure 6B:
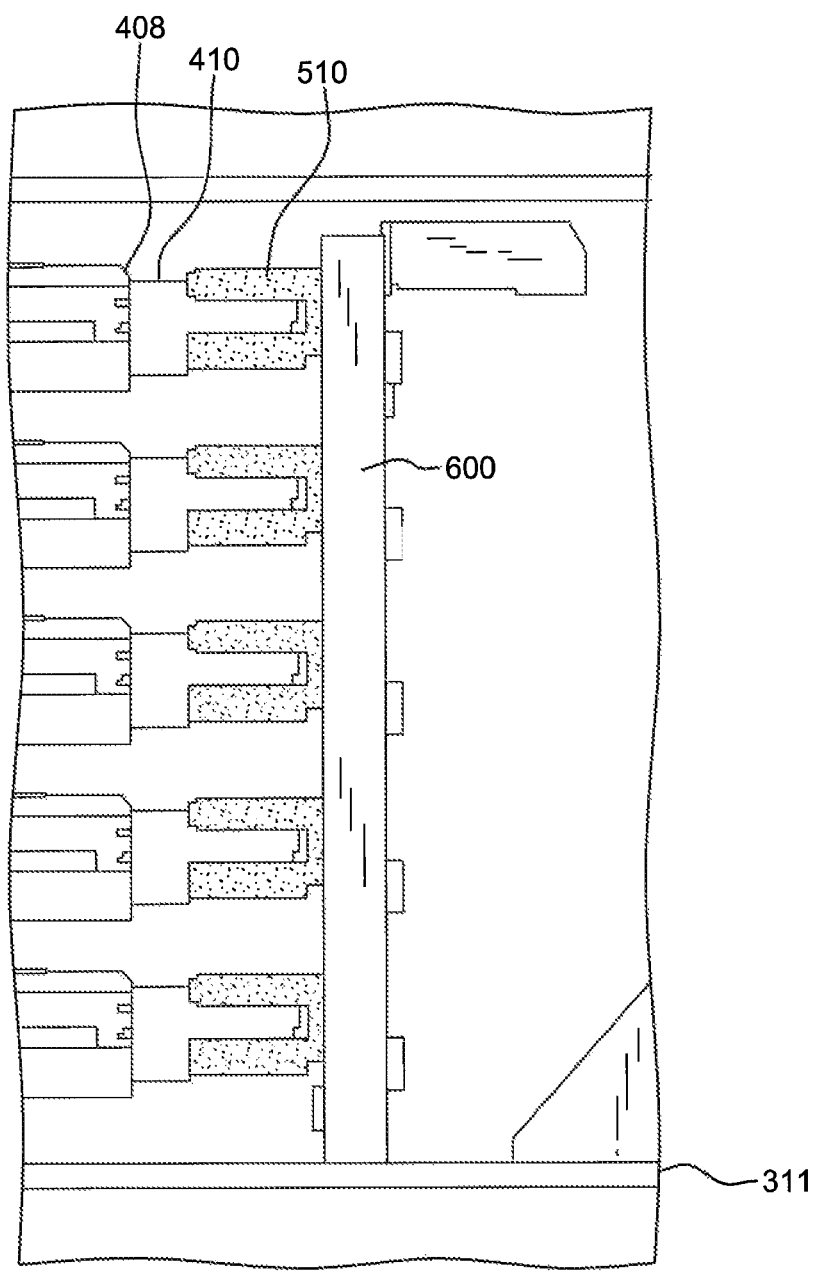
FIG. 6B is a partial cross-sectional elevational view of the electronic subsystem of FIGS. 4-6A, with five field-replaceable units docked and latched therein and illustrating coupling of the first connectors of the field-replaceable units to respective second connectors coupled to a mid plane disposed within the enclosure, in accordance with one or more aspects of the present invention.

FIGS. 6A & 6B are plan and cross-sectional elevational depictions, respectively, of one embodiment of electronic subsystem 310 with, by way of example, five field-replaceable units 400 operationally docked within respective, vertically aligned FRU-receiving slots of the electronics enclosure 311. Referring to FIG. 6A, field-replaceable unit 400 is shown in docked position, with latch mechanism 405 in latched position, at first side 407 of the field-replaceable unit 400, and with first connectors 410 at second side 408 operatively coupled to second connectors 510 residing on, for example, a mid-plane board 600 (see FIG. 6B) disposed within enclosure 311 of the electronic subsystem 310.

As explained herein, latch mechanism 405 comprises a latch 605 having a latch surface 610 that physically contacts, via an interference fit, a hard stop 611 associated with enclosure 311. This latch surface 610 and hard stop 611 are configured to physically contact during transition of latch 605 from an open to latched position, and in doing so, allow for a force to be applied by the compliant spring member acting on the pivot of the latch mechanism. This results in a positive pressure being applied on the unit at the first side of the unit directed towards the second side of the unit.

Figure 7:
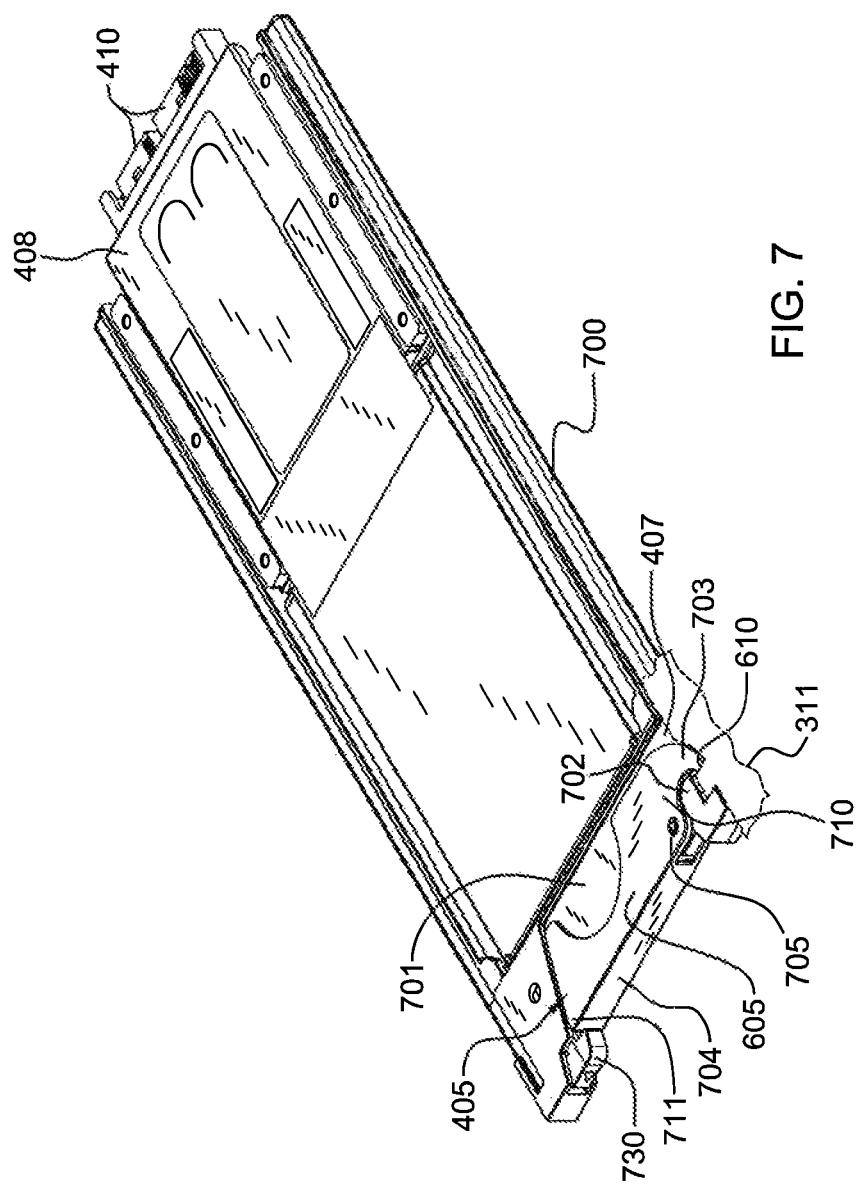
FIG. 7 is an enlarged depiction of one embodiment of a field-replaceable unit, shown with the latch mechanism at a first side, and at least one first connector at a second side thereof, in accordance with one or more aspects of the present invention.

FIG. 7 illustrates in greater detail one embodiment of a field-replaceable unit 400, with latch mechanism 405 disposed at first side 407 and at least one first connector 410 disposed at second side 408 thereof. In one embodiment, the field-replaceable unit is an electronics assembly, such a solid state drive (SSD) assembly (as one example only). Also, in one embodiment, field-replaceable unit 400 includes a rigid frame or sled 700 which facilitates transfer of the positive pressure applied by the latch mechanism 405 at the first side 407 to the second side 408 thereof, which as noted may be configured to ensure secure electrical and mechanical coupling of the at least one first connector 410 to a respective at least one second connector 510 (FIGS. 6A & 6B).

In the embodiment of FIG. 7, latch 605 of latch mechanism 405 comprises (by way of example) an approximately U-shaped structure in end elevational view, which wraps around a portion of first side 407 of field-replaceable unit 400 when in the latched position. A first cut-out region 701 in latch 605 may be provided to, for example, facilitate manual rotation of the latch between open and latched positions. Latch mechanism 405 may further comprise a second cut-out region 702 at a first end 710 of latch 605 which defines a curved extension 703 at the first end 710, with the latch surface 610 to interference-fit with the hard stop 611 of the enclosure 311 being at the end of the curved extension 703. Note that this particular embodiment is one configuration only of the latching concepts disclosed herein.

A pivot 705 is provided at or near first end 710 of latch 605, which facilitates rotating of the latch between the open and latched positions, and a spring-biased, latch catch-release trigger 730 is shown physically engaging a bottom edge 704 of latch 605 adjacent to second end 711 of latch 605.

FIGS. 8A-8B & 9A-9B depict alternate implementations of the latch mechanism disclosed herein, each with a compliant spring member configured to act on pivot 705 during latching of the field-replaceable unit within the enclosure.

Figure 8B:
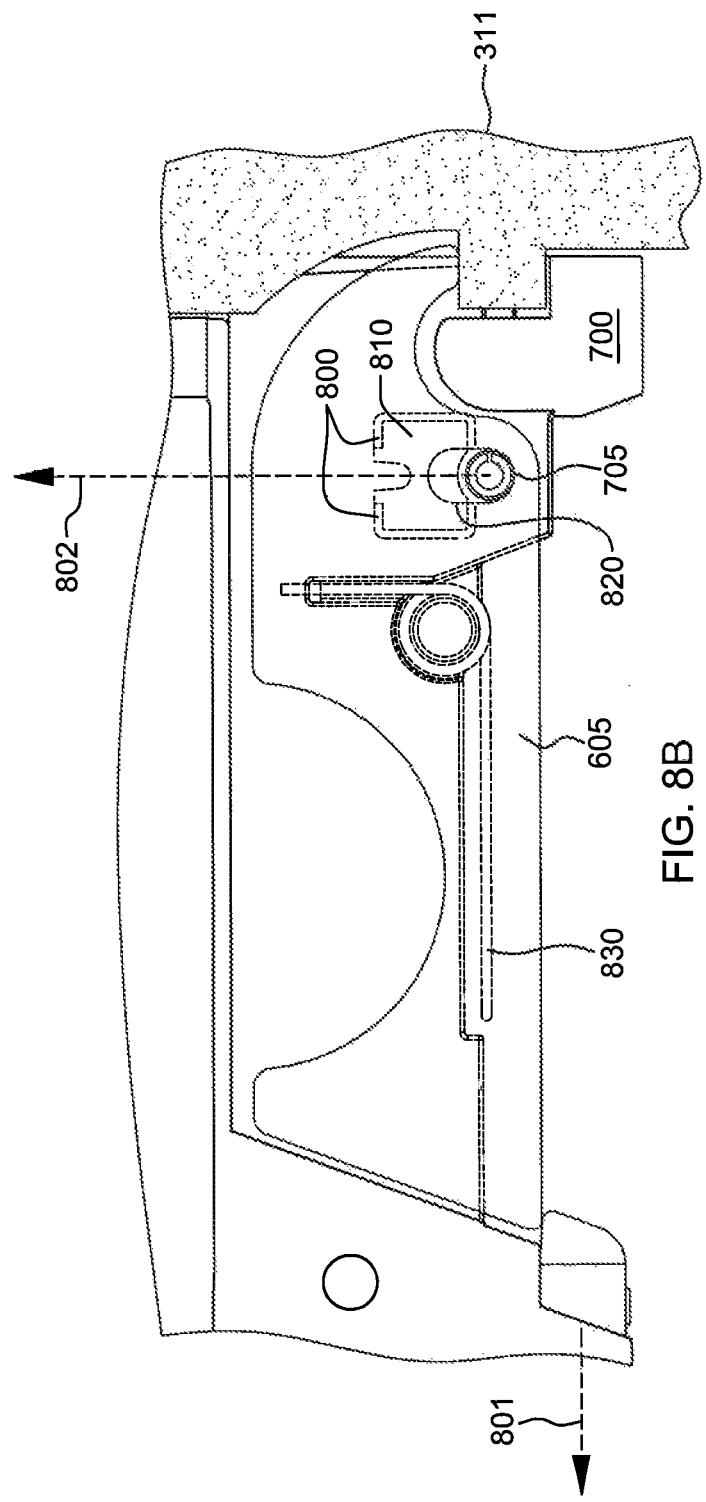
FIG. 8B is a partial top plan view of the latch mechanism of FIG. 8A and field-replaceable unit of FIG. 7, shown with the latch in the latched position, in accordance with one or more aspects of the present invention.

Referring first to the embodiment of FIGS. 8A & 8B, a spring clip 800 (such as a metal spring) is shown disposed within a recess 810 in the field-replaceable unit 400, or more particularly, within a recess in the sled 700 adjacent to first side 407 of the field-replaceable unit 400 and positioned such that the spring clip 800 acts on and physically contacts the pivot 705. In one embodiment, the spring clip 800 wraps partially around the pivot 705 as shown. Further, in one embodiment, pivot 705 is interference-fit to latch 605 above and below sled 700, and is loosely fit to the sled 700 by passing through an enlarged opening 820 in the sled. The enlarged opening may be an elongate-shaped opening oriented lengthwise within the sled. As illustrated in FIG. 8B, a torsion spring 830 may also be provided, spaced separate from pivot 705. This torsion spring facilitates opening the latch upon release of the latch catch-release trigger 730 from engagement with latch 605.

In operation, latch 605 may be opened by actuating latch catch-release trigger 730 in the direction of arrow 801 to move the trigger away from the lower edge of latch 605. This action causes the torsional spring 830 to assist with rotating of latch 605 to an open position, away from the field-replaceable unit. This action also concurrently withdraws the positive pressure from being applied by the latch mechanism, thereby assisting with decoupling of, for example, the at least one first connector at the second side of the field-replaceable unit and the at least one second connector associated with the enclosure.

During latching, with the field-replaceable unit docked within the enclosure, the operator actuates latch 605 until latch surface 610 physically contacts hard stop 611 of (or more generally, associated with) the enclosure, at which point further rotating of latch 605 towards the first end of the field-replaceable unit results in the pivot compressing spring clip 800, which in turn generates the positive pressure directed lengthwise, that is, in the direction of arrow 802, towards the second side of the field-replaceable unit. The operator continues to rotate latch 605 until the latch catch-release trigger 730 engages the bottom edge of the latch, thereby latching the latch mechanism in the latched position.

Figure 9B:
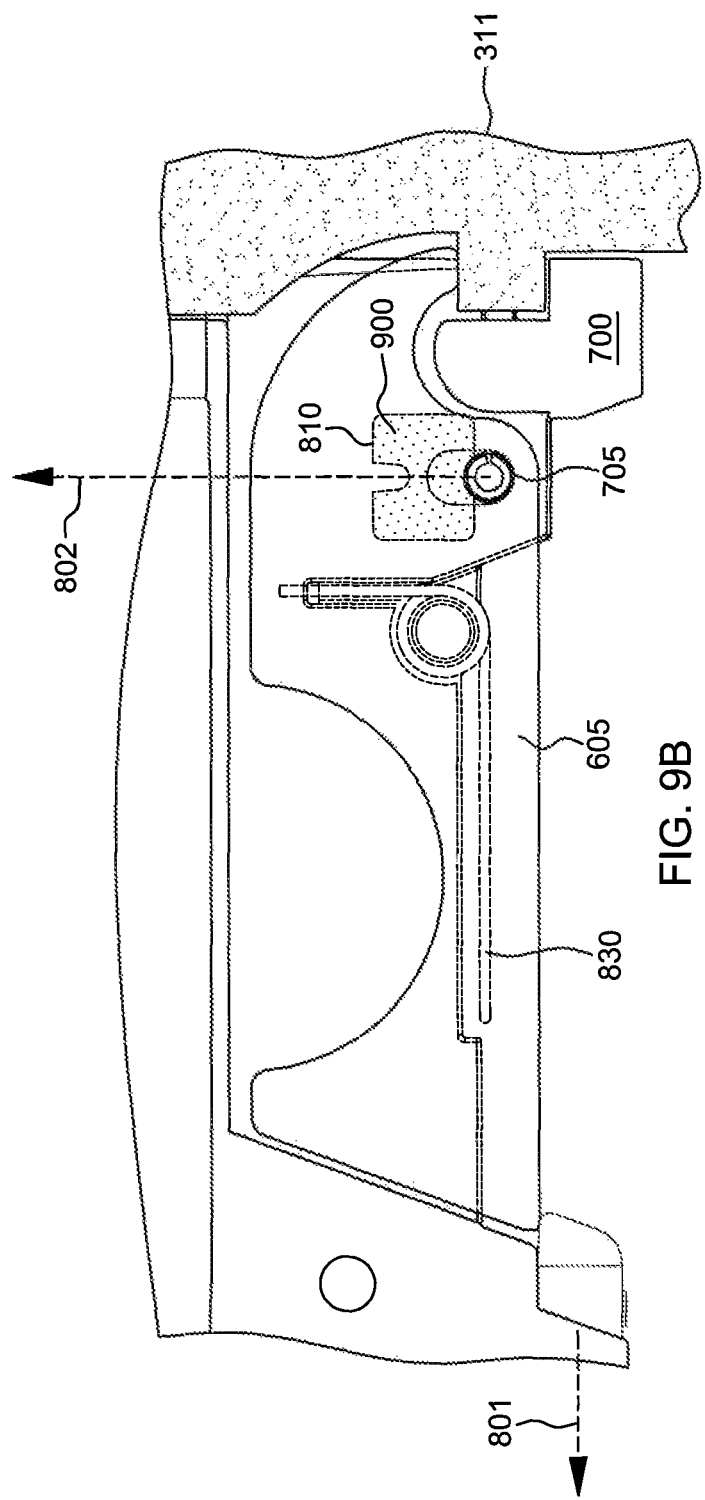
FIG. 9B is a partial top plan view of the latch mechanism of FIG. 9A and field-replaceable unit of FIG. 7, shown with the latch in the latched position, in accordance with one or more aspects of the present invention.

As noted, FIGS. 9A & 9B depict an alternate embodiment of a compliant spring member configured to act on pivot 705 during latching of the field-replaceable unit within the electronics enclosure. This embodiment is substantially identical to that described above in connection with FIGS. 8A & 8B, except that the spring clip 800 of FIGS. 8A & 8B is replaced with a compliant, elastomeric material 900, configured (in one embodiment) to reside within the recess 810 in the frame 700 of the field-replaceable unit. The compliant, elastomeric material may be any rubber or other elastomeric material chosen and configured to act on and physically contact pivot 705 and generate the positive pressure desired for a particular application to ensure secure, fixed positioning of, for example, the at least one first connector at the other end of the field-replaceable unit relative to the at least one second connector associated with the enclosure. Operation of the latch mechanism is substantially identical to that described above in connection with the embodiment of FIGS. 8A & 8B.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention.

What is claimed is:

1. An apparatus comprising:
a unit to be latched within an enclosure; and
a latch mechanism for latching the unit within the enclosure, the latch mechanism comprising:
a rotatable latch coupled to the unit via a pivot extending through and movable within an elongate slot in the unit, the pivot being disposed at a first side of the unit;
a compliant spring member associated with the unit and, at least in part, covering, in an uncompressed state, the elongate slot in the unit through which the pivot extends, the compliant spring member acting on the pivot and compressing with rotating of the latch from an open position to a latched position during latching of the unit within the enclosure, the compressing facilitating provision of a positive pressure on the unit directed towards a second side of the unit opposite to the first side thereof with latching of the unit within the enclosure, the compliant spring member residing within a recess within the unit overlying, at least in part, the elongate slot in the unit through which the pivot extends, and comprising a flat, compliant elastomeric material physically contacting and partially surrounding the pivot; and
wherein the latch is configured with a latch surface that physically contacts a hard stop associated with the enclosure with latching of the unit within the enclosure, and wherein subsequent to physically contacting of the latch surface to the hard stop, continued rotating of the latch towards the latched position results, in part, in the pivot compressing the compliant spring member, the physical contacting of the hard stop and the subsequent compressing of the compliant spring member providing the positive pressure on the unit at the first side thereof with the latching of the unit within the enclosure.

2. The apparatus of claim 1, wherein the pivot couples a first end of the latch to the unit, and the latch further comprises an extension disposed at the first end thereof, the latch surface that physically contacts the hard stop with rotating of the latch towards the latched position comprising a surface of the extension.

3. The apparatus of claim 2, wherein in the latched position, a latch catch-release trigger engages the latch at a second end of the latch opposite to the first end thereof and holds the latch in the latched position.

4. The apparatus of claim 1, wherein the pivot couples to the latch via an interference fit, and is loose-fit to the unit, passing through the elongate slot in the unit.

5. The apparatus of claim 1, wherein at least one first connector is disposed at the second side of the unit, and the positive pressure applied across the unit with latching of the unit within the enclosure facilitates secure coupling of the at least one first connector to at least one second connector associated with the enclosure.

6. The apparatus of claim 1, wherein the unit is a field-replaceable unit, and the enclosure is an electronics enclosure.

7. The apparatus of claim 1, wherein the unit is a field-replaceable unit, the field-replaceable unit comprising a solid state drive (SSD) assembly.

8. An electronic system comprising:
   at least one field-replaceable unit (FRU);
   an enclosure comprising at least one FRU-receiving slot, the at least one field-replaceable unit being configured to operationally dock within the at least one FRU-receiving slot of the enclosure;
   at least one latching mechanism, one latching mechanism of the at least one latching mechanism being disposed at a first side of one field-replaceable unit of the at least one field-replaceable unit, the latching mechanism comprising a rotatable latch coupled to the field-replaceable unit via a pivot extending through and moveable within an elongate slot in the unit, and a compliant spring member associated with the unit and, at least in part, covering, in an uncompressed state, the elongate slot in the unit through which the pivot extends, wherein rotating of the latch from an open position to a latched position during latching of the one field-replaceable unit within the enclosure facilitates provision of a positive pressure on the one field-replaceable unit directed towards a second side of the one field-replaceable unit opposite to the first side thereof, the positive pressure resulting, at least in part, from the compliant spring member acting on the pivot and compressing with rotating of the latch towards the latched position during latching of the one field-replaceable unit within the enclosure, the compliant spring member residing within a recess within the unit overlying, at least in part, the elongate slot in the unit through which the pivot extends and comprising a flat, compliant elastomeric material physically contacting and partially surrounding the pivot; and
   wherein the latch is configured with a latch surface that physically contacts a hard stop associated with the enclosure with latching of the one field-replaceable unit within the enclosure, and wherein subsequent to physical contacting of the latch surface to the hard stop, continued rotation of the latch towards the latched position results, in part, in the pivot compressing the compliant spring member, the physical contacting of the hard stop and the subsequent compressing of the compliant spring member providing the positive pressure on the one field-replaceable unit with the latching thereof in the enclosure.

9. The electronic system of claim 8, further comprising at least one connector assembly, one connector assembly of the at least one connector assembly comprising at least one first connector associated with the one field-replaceable unit and at least one second connector disposed within the enclosure, wherein docking of the one field-replaceable unit within one FRU-receiving slot of the enclosure results in coupling of the at least one first connector to the at least one second connector, and latching of the one field-replaceable unit within the enclosure via the one latching mechanism results in the positive pressure being applied, at least in part, to the coupling of the at least one first connector to the at least one second connector of the one connector assembly to ensure electrical connection between the at least one first connector and the at least one second connector.

10. The electronic system of claim 8, wherein the pivot couples a first end of the latch to the one field-replaceable unit, and the latch further comprises an extension disposed at the first end thereof, the latch surface that physically contacts the hard stop with rotating of the latch towards the latched position comprising a surface of the extension.

11. The electronic system of claim 10, wherein in the latched position, a latch catch-release trigger engages the latch at a second end of the latch opposite to the first end thereof, and holds the latch in the latched position.

12. The electronic system of claim 8, wherein the pivot couples to the latch via an interference fit, and is loose-fit to the one field-replaceable unit, passing through the elongate slot in the one field-replaceable unit.

13. The electronic system of claim 8, wherein the at least one field-replaceable unit comprises at least one sold state drive (SSD) assembly.

14. A method of facilitating secure latching of a field-replaceable unit within an enclosure, the method comprising:
   providing a latch mechanism coupled to the field-replaceable unit and configured to facilitate secure latching of the field-replaceable unit within the enclosure, the latch mechanism comprising:
   a rotatable latch coupled to the unit via a pivot extending through and movable within an elongate slot in the unit, the pivot being disposed at a first side of the unit; and
   a compliant spring member associated with the unit and at least in part, covering, in an uncompressed state, the elongate slot in the unit through which the pivot extends, the compliant spring member acting on the pivot and compressing with rotating of the latch from an open position to a latched position during latching of the unit within the enclosure, the compressing facilitating provision of a positive pressure on the unit directed towards a second side of the unit opposite to the first side thereof with latching of the unit within the enclosure, the compliant spring, member residing within a recess within the unit overlying, at least in part, the elongate slot in the unit through which the pivot extends, and comprising a flat compliant elastomeric material physically contacting and partially surrounding the pivot; and
   wherein the latch is configured with a latch surface that physically contacts a hard stop associated with the enclosure with latching of the field-replaceable unit within the enclosure, and wherein subsequent to physical contacting of the latch surface to the hard stop, continued rotating of the latch towards the latched position results, in part, in the pivot compressing the compliant spring member, the physical contacting of the hard stop and the subsequent compressing of the compliant spring member providing the positive pressure on the field-replaceable unit with the latching thereof within the enclosure.

15. The method of claim 14, wherein the pivot couples a first end of the latch to the field-replaceable unit, and the latch further comprises an extension disposed at the first end thereof, the latch surface that physically contacts the hard stop with rotating of the latch towards the latched position comprising a surface of the extension, and wherein in the latched position, a latch catch-release trigger engages the latch at a second end of the latch opposite to the first end thereof and holds the latch in the latched position.

* * * * *